(12) United States Patent
Kang

(10) Patent No.: US 8,487,603 B2
(45) Date of Patent: Jul. 16, 2013

(54) REFERENCE VOLTAGE GENERATING CIRCUIT OF SEMICONDUCTOR MEMORY APPARATUS

(75) Inventor: Khil-Ohk Kang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 1509 days.

(21) Appl. No.: 11/822,270

(22) Filed: Jul. 3, 2007

(65) Prior Publication Data

US 2008/0111533 A1    May 15, 2008

(30) Foreign Application Priority Data

Nov. 13, 2006 (KR) .................. 10-2006-0111436

(51) Int. Cl.
*G05F 1/595* (2006.01)
*G05F 1/613* (2006.01)
*G05F 1/614* (2006.01)

(52) U.S. Cl.
USPC ............ 323/313; 323/274; 323/275; 323/268

(58) Field of Classification Search
USPC ................. 323/266, 268, 270, 273, 274, 275, 323/311, 312, 313, 314
See application file for complete search history.

(56) References Cited

U.S. PATENT DOCUMENTS

| 5,349,559 A | * | 9/1994 | Park et al. ................ 365/201 |
| 5,434,498 A | * | 7/1995 | Cordoba et al. ............ 323/313 |
| 5,497,348 A | * | 3/1996 | Tsay ..................... 365/189.09 |
| 5,889,719 A | * | 3/1999 | Yoo et al. ................. 365/226 |
| 6,373,753 B1 | | 4/2002 | Proebsting |
| 6,751,134 B2 | * | 6/2004 | Choi et al. ................ 365/201 |
| 6,853,567 B2 | | 2/2005 | Kwon |
| 6,958,947 B2 | * | 10/2005 | Park et al. ................ 365/228 |
| 7,002,329 B2 | * | 2/2006 | Agari et al. .............. 323/284 |
| 2004/0208026 A1 | | 10/2004 | Kwon |
| 2004/0239409 A1 | | 12/2004 | Jang et al. |
| 2005/0231269 A1 | * | 10/2005 | Kim et al. ................ 327/538 |
| 2006/0097804 A1 | | 5/2006 | Im et al. |
| 2007/0139024 A1 | * | 6/2007 | Zolfaghari ............... 323/273 |
| 2007/0280008 A1 | * | 12/2007 | Byeon .................. 365/189.09 |

FOREIGN PATENT DOCUMENTS

| JP | 04-015949 | | 1/1992 |
| JP | 05-022100 | | 1/1993 |
| JP | 10-049243 | | 2/1998 |
| JP | 2003030985 | | 1/2003 |
| JP | 2005318034 | | 11/2005 |
| KR | 2006-0049123 | * | 5/2006 |

* cited by examiner

*Primary Examiner* — Adolf Berhane
*Assistant Examiner* — Nusrat Quddus
(74) *Attorney, Agent, or Firm* — Venable LLP; Jeffri A. Kaminski

(57) ABSTRACT

A voltage generating circuit of semiconductor integrated circuit includes: a voltage controller that detects the level of an external supply voltage and outputs a voltage control signal; a voltage supplier that outputs the external supply voltage or a first internal voltage in response to the voltage control signal; and a first reference voltage generator that is supplied with an output voltage of the voltage supplier and generates a first reference voltage.

17 Claims, 4 Drawing Sheets

REFERENCE VOLTAGE GENERATING CIRCUIT OF SEMICONDUCTOR MEMORY APPARATUS

CROSS-REFERENCE TO RELATED PATENT APPLICATION

This application claims the benefit of Korean Patent Application No. 10-2006-0111436, filed on Nov. 13, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and more particularly, to a voltage generating circuit.

2. Related Art

In general, a semiconductor integrated circuit is supplied with an external supply voltage VDD and generates a reference voltage VREF. A circuit for generating an internal voltage is supplied with the reference voltage VREF, and generates and outputs internal voltages at different levels according to the purpose of design.

For example, a circuit for generating an elevated voltage generates an elevated voltage VPP that is used to drive a cell transistor in response to the reference voltage VREF, and a circuit for generating a core voltage generates a core voltage VCORE that is used to store a voltage at a high level in a cell capacitor in response to the reference voltage VREF.

Therefore, the level of the reference voltage VREF needs to be stably maintained. When the level of the reference voltage VREF is not stable, the level of the internal voltage that is generated in response to the reference voltage VREF becomes unstable.

As shown in FIG. 1, a voltage generating circuit of a semiconductor integrated circuit according to the related art includes a first reference voltage generator 10, a second reference voltage generator 20, and an internal voltage generator 30.

The first reference voltage generator 10 is supplied with the external supply voltage VDD and generates a first reference voltage VRO_O. The second reference voltage generator 20 is supplied with the external supply voltage VDD, and generates a second reference voltage VREF_O in response to the first reference voltage VRO_O.

The internal voltage generator 30 generates and outputs an internal voltage VINT_O in response to the second reference voltage VREF_O. The internal voltage generator 30 generates the internal voltage VINT_O by using one of the second reference voltages VREF_O that are output at different levels according to the purpose of design, or the internal voltage generator 30 generates the internal voltage VINT_O by being supplied with the second reference voltage VREF_O at a constant level and appropriately adjusting the supplied second reference voltage VREF_O.

The first reference voltage generator 10 may be formed of a general bandgap reference voltage generating circuit.

The operation of the first reference voltage generator 10 shown in FIG. 2 will now be described.

When the external supply voltage VDD increases from 0 V to a target voltage, a comparison signal VBG that is output from a comparing unit COM1 is changed to a low level. When the comparison signal VBG is changed to the low level, a first transistor P1 is turned on, the external supply voltage VDD is applied to overlap the first reference voltage VRO_O, and thus, the first reference voltage VRO_O increases.

When the first reference voltage VRO_O increases, the voltage of a first node S1 and the voltage of a second node S2 are increased according to the resistance ratios of a plurality of resistors R1 to R3, a second transistor BJT1, and a third transistor BJT2. The first transistor P1 is a PMOS transistor, and the second transistor BJT1 and the third transistor BJT2 are bipolar junction transistors.

A designer appropriately adjusts the values of the plurality of resistors R1 to R3 and the sizes of the second transistor BJT1 and the third transistor BJT2 to control an output level of the first reference voltage VRO_O.

The second reference voltage generator 20 may be formed of a general reference voltage generating circuit. Though not shown, the second reference voltage generator 20 compares the first reference voltage VRO_O with the voltage of a predetermined node. The second reference voltage generator 20 applies the external supply voltage VDD to the predetermined node according to the comparison result, divides the voltage of the predetermined node, and outputs the second reference voltage VREF_O.

The first reference voltage generator 10 and the second reference voltage generator 20 are supplied with the external supply voltage VDD, and generate the first reference voltage VRO_O and the second reference voltage VREF_O, respectively. When the external supply voltage VDD increases, the first reference voltage VRO_O and the second reference voltage VREF_O also increase.

As shown in FIG. 3, when the external supply voltage VDD increases, the level of the first reference voltage VRO_O that is output from the first reference voltage generator 10 according to the related art increases to a predetermined voltage level. However, even though the level of the first reference voltage VRO_O needs to remain constant, if the external supply voltage VDD continues to increase, the first reference voltage VRO_O also increases.

The graph of FIG. 3 shows that, when the first reference voltage VRO_O increases, the second reference voltage VREF_O also increases, and thus the internal voltage generator 30 that is supplied with the second reference voltage VREF_O generates the internal voltage VINT_O, which is not stable. This causes an erroneous operation to occur in an internal circuit that uses the unstable internal voltage VINT_O.

SUMMARY OF THE INVENTION

One embodiment may be a voltage generating circuit of a semiconductor integrated circuit that may stabilize the levels of reference voltages and the level of an internal voltage even when an external supply voltage increases.

According one embodiment, a voltage generating circuit of a semiconductor integrated circuit includes: a voltage controller that may detect the level of an external supply voltage and outputs a voltage control signal; a voltage supplier that may output the external supply voltage or a first internal voltage in response to the voltage control signal; and a first reference voltage generator that may be supplied with an output voltage of the voltage supplier and may generate a first reference voltage.

DESCRIPTION OF EXEMPLARY EMBODIMENT

An exemplary embodiment will now be described in detail with reference to the accompanying drawings.

Figure 4:
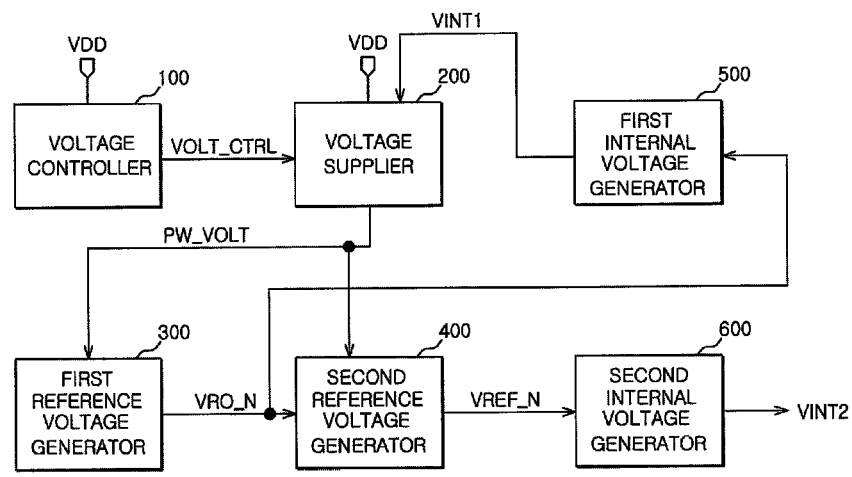
FIG. 4 is an exemplary internal block diagram illustrating a voltage generating circuit of a semiconductor integrated.

Referring to FIG. 4, a voltage generating circuit of a semiconductor integrated circuit according to one embodiment may include a voltage controller 100, a voltage supplier 200, a first reference voltage generator 300, a second reference voltage generator 400, a first internal voltage generator 500, and a second internal voltage generator 600.

The voltage controller 100 may detect the level of an external supply voltage VDD and output a voltage control signal VOLT_CTRL. The voltage controller 100 may be realized by, for example, using a general detector circuit.

The voltage supplier 200 may output the external supply voltage VDD or a first internal voltage VINT1 in response to the voltage control-signal VOLT_CTRL. The voltage supplier 200 may be controlled by the voltage control signal VOLT_CTRL, and may be formed of a general switching element that may supply the external supply voltage VDD or the first internal voltage VINT1.

The first reference voltage generator 300 may be supplied with an output voltage PW_VOLT of the voltage supplier 200 and may generate a first reference voltage VRO_N. The second reference voltage generator 400 may be supplied with the output voltage PW_VOLT and may generate a second reference voltage VREF_N in response to the first reference voltage VRO_N.

The first internal voltage generator 500 may generate and output the first internal voltage VINT1 in response to the first reference voltage VRO_N. The second internal voltage generator 600 may generate and output a second internal voltage VINT2 in response to the second reference voltage VREF_N.

Figure 1:
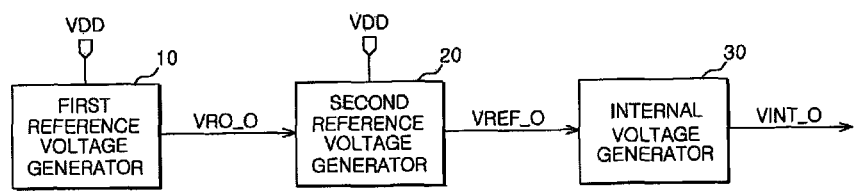
FIG. 1 is an internal block diagram illustrating a voltage generating circuit of a semiconductor integrated circuit according to the related art.
Figure 2:
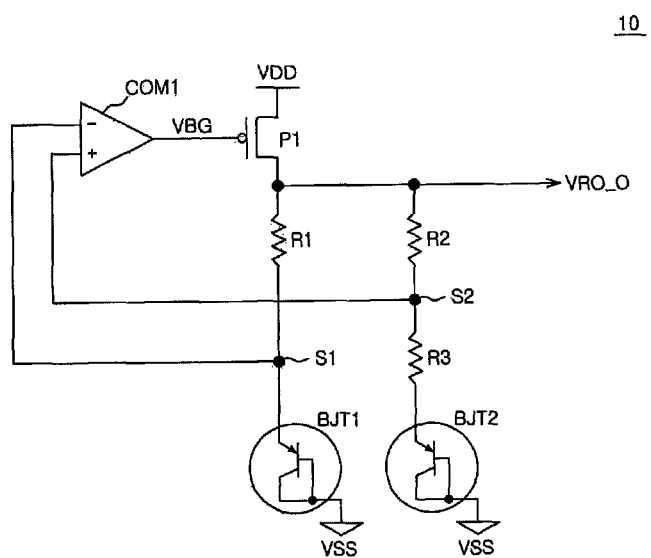
FIG. 2 is a circuit diagram illustrating an example of a first reference voltage generator shown in FIG. 1.
Figure 3:
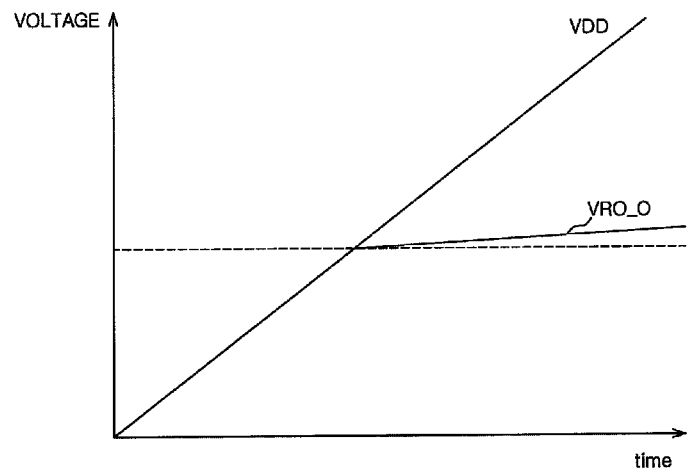
FIG. 3 is a graph illustrating a change of a first reference voltage according to an external supply voltage in the first reference voltage generator shown in FIG. 2.

The first reference voltage generator 300 may be formed of, for example, a reference voltage generating circuit shown in FIG. 2. Further, the first reference voltage generator 300 according to one embodiment, may use the output voltage PW_VOLT of the voltage supplier 200 as input voltage. That is, the first reference voltage generator 300 may use the external supply voltage VDD or the first internal voltage VINT1 as the input voltage.

The second reference voltage generator 400 may be realized by using a general circuit for generating a reference voltage. Though not shown, the second reference voltage generator 400 may compare the first reference voltage VRO_N with a voltage of a predetermined node, and may apply the output voltage PW_VOLT of the voltage supplier 200 to the predetermined node according to the comparison result. Further, the second reference voltage generator 400 may divide the voltage of the predetermined node and output the second reference voltage VREF_N.

The first internal voltage generator 500 and the second internal voltage generator 600 may generate the first internal voltage VINT1 and the second internal voltage VINT2 from the external supply voltage VDD in response to the first reference voltage VRO_N and the second reference voltage VREF_N, respectively. The first internal voltage generator 500 or the second internal voltage generator 600 may be formed of a circuit for generating a voltage, such as, for example, a general voltage down converter.

Figure 5:
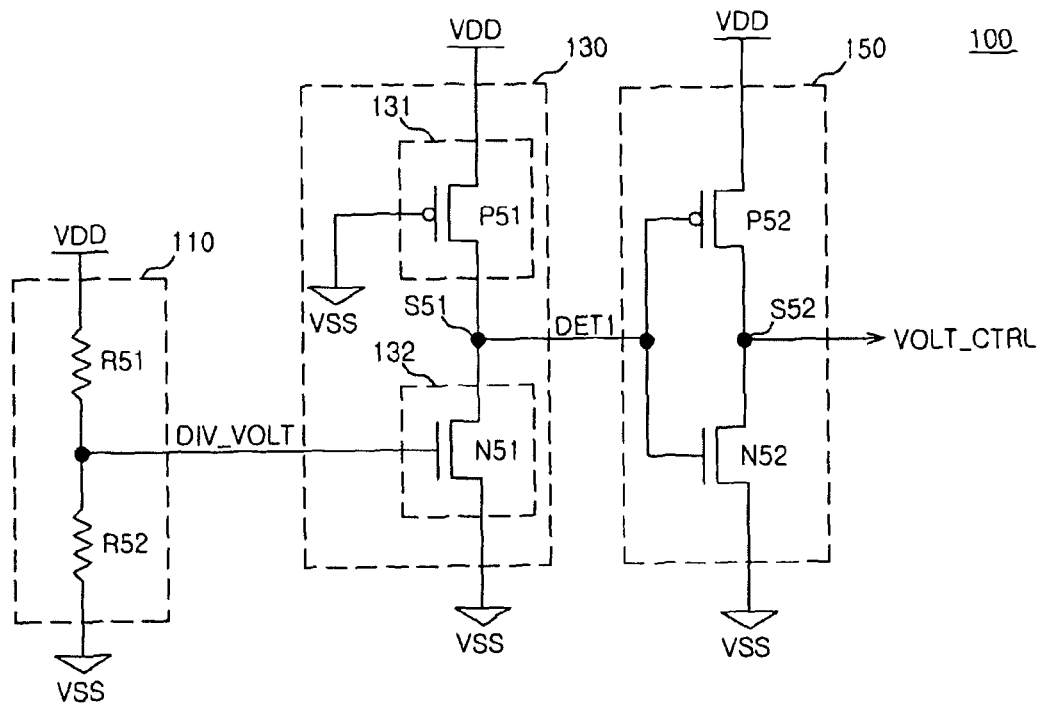
FIG. 5 is an exemplary internal circuit diagram illustrating a voltage controller shown in FIG. 4.

FIG. 5 is an exemplary internal circuit diagram illustrating the voltage controller 100 shown in FIG. 4.

The voltage controller 100 may include a voltage divider 110 that may divide the external supply voltage VDD and output a divided voltage DIV_VOLT, a comparing unit 130 that may output a comparison signal DET1 in response to the divided voltage DIV_VOLT, and a signal driver 150 that may drive the comparison signal DET1 and outputs the voltage control signal VOLT_CTRL.

The voltage divider 110 may include a plurality of resistors R51 and R52 that may be connected in series between the external supply voltage terminal VDD and a ground voltage terminal VSS, and may output the divided voltage DIV_VOLT from a node between the first resistor R51 and the second resistor R52.

The comparing unit 130 may include a pull-up portion 131 and a pull-down portion 132.

The pull-up portion 131 may pull up the voltage of a first node S51 in response to the divided voltage DIV_VOLT.

The pull-down portion 132 may pull down the voltage of the first node S51 in response to the divided voltage DIV_VOLT. The comparison signal may be the voltage of the first node S51.

The pull-up portion 131 may be formed of a first transistor P51 that may include a gate to which the ground voltage VSS may be applied, a source to which the external supply voltage VDD may be applied, and a drain that may be connected to the first node S51.

The pull-down portion 132 may be formed of a second transistor N51 that may include a gate to which the divided voltage DIV_VOLT may be applied, a drain that may be connected to the first node S51, and a source to which the ground voltage VSS may be applied. The comparison signal DET1 may be output from the first node S51.

The signal driver 150 may receive the comparison signal, drive the received comparison signal, and output the voltage control signal.

The signal driver 150 may be implemented by a third transistor P52 and a fourth transistor N52.

The third transistor P52 may include a gate to which the comparison signal DET1 may be input, a source to which the external supply voltage VDD may be applied, and a drain that may be connected to a second node S52.

The fourth transistor N52 may include a gate to which the comparison signal DET1 may be input, a drain that may be connected to the second node S52, and a source to which the ground voltage VSS may be applied. The voltage control signal VOLT_CTRL may be output from the second node S52.

Figure 6:
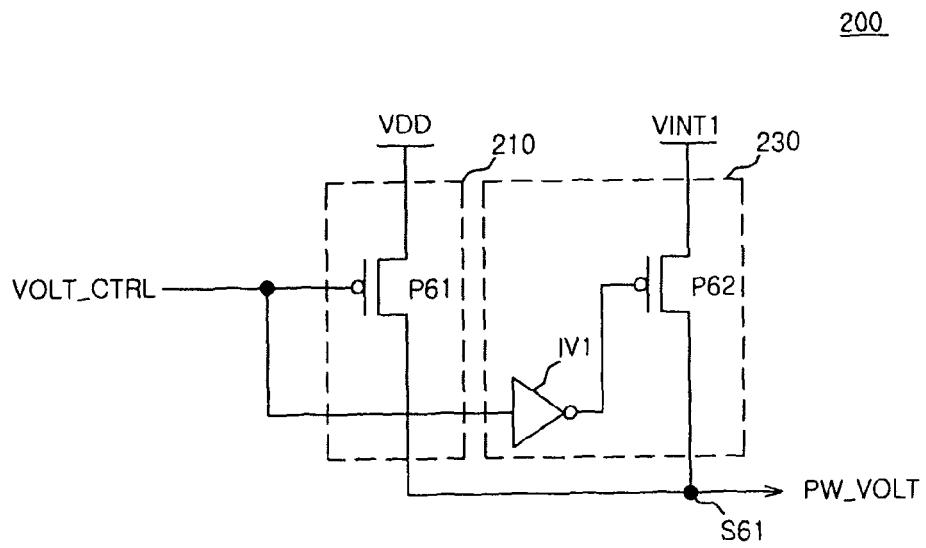
FIG. 6 is an exemplary internal block diagram illustrating a voltage generating unit shown in FIG. 4.

FIG. 6 is an exemplary internal circuit diagram illustrating the voltage supplier 200 shown in FIG. 4.

The voltage supplier 200 may include a first switching unit 210 and a second switching unit 230.

The first switching unit 210 may output the external supply voltage VDD to a third node S61 in response to the voltage control signal VOLT_CTRL.

The second switching unit 230 may output the first internal voltage VINT1 to the third node S61 in response to the voltage control signal VOLT_CTRL.

The voltage supplier 200 may activate the first switching unit 210 or the second switching unit 230 in response to the voltage control signal VOLT_CTRL.

The first switching unit 210 may include a fifth transistor P61 that may include a gate to which the voltage control signal VOLT_CTRL may be input, a source to which the external supply voltage VDD may be applied and a drain that may be connected to the third node S61.

The second switching unit 230 may include an inverter IV1 that may invert the voltage control signal VOLT_CTRL, and a sixth transistor P62 that may include a gate connected to an output terminal of the inverter IV1, a source to which the first internal voltage VINT1 may be applied, and a drain that may be connected to the third node S61.

The output voltage PW_VOLT may be output from the third node P61, and the output voltage PW_VOLT may be the external supply voltage VDD or the first internal voltage VINT1.

The operation of the voltage generating circuit according to one embodiment will be described with reference to FIGS. 4 to 6.

The voltage generating circuit according to one embodiment may detect the level of the external supply voltage VDD and apply the external supply voltage VDD or the first internal voltage VINT1 as voltage to the first reference voltage generator 300 and the second reference voltage generator 400. In this way, the first reference voltage generator 300 and the second reference voltage generator 400 may generate the first reference voltage VRO_N and the second reference voltage VREF_N, respectively, whose levels may be stable.

Further, the voltage controller 100 may detect the level of the external supply voltage VDD and output the voltage control signal VOLT_CTRL in response to the level of the external supply voltage VDD.

In the voltage controller 100 shown in FIG. 5, for example, it may be assumed that, when the external supply voltage VDD reaches a predetermined voltage (for example, 1.3 V), the divided voltage DIV_VOLT may exceed a threshold voltage Vth of the second transistor N51 that may be provided in the comparing unit 130.

When the external supply voltage VDD is lower than the predetermined voltage (1.3 V), the divided voltage DIV_VOLT may be lower than the threshold voltage Vth of the second transistor N51. In this case, the comparing unit 130 may output the comparison signal DET1 at a high level, and the signal driver 150 may invert the comparison signal DET1 and output the voltage control signal VOLT_CTRL at a low level.

When the external supply voltage VDD is higher than the predetermined voltage (1.3 V), the divided voltage DIV_VOLT may turn on the second transistor N51. The comparing unit 130 may output the comparison signal DET1 at a low level, and the signal driver 150 may invert the comparison signal DET1 and output the voltage control signal VOLT_CTRL at a high level.

When receiving the voltage control signal VOLT_CTRL at a low level, the voltage supplier 200 may turn on the fifth transistor P61 and output the external supply voltage VDD as the output voltage PW_VOLT. When receiving the voltage control signal VOLT_CTRL at a high level, the voltage supplier 200 may turn on the sixth transistor P62 and output the first internal voltage VINT1 as the output voltage PW_VOLT.

The output voltage PW_VOLT of the voltage supplier 200 may be input to the first reference voltage generator 300 and the second reference voltage generator 400. The first reference voltage generator 300 and the second reference voltage generator 400 may generate and output the first reference voltage VRO_N and the second reference voltage VREF_N in response to the output voltage PW_VOLT, respectively. At this time, the first internal voltage generator 500 may generate the first internal voltage VINT1 in response to the first reference voltage VRO_N, and the second internal voltage generator 600 may generate the second internal voltage VINT2 in response to the second reference voltage VREF_N.

When the external supply voltage VDD is lower than the predetermined voltage, the first reference voltage generator 300 and the second reference voltage generator 400 may be supplied with the external supply voltage VDD, and may generate the first reference voltage VRO_N and the second reference voltage VREF_N, respectively. When the external supply voltage VDD is higher than the predetermined voltage, the first reference voltage generator 300 and the second reference voltage generator 400 may be supplied with the first internal voltage VINT1 whose level may remain constant even when the external supply voltage VDD increases, and may generate the first reference voltage VRO_N and the second reference voltage VREF_N, respectively.

Figure 7:
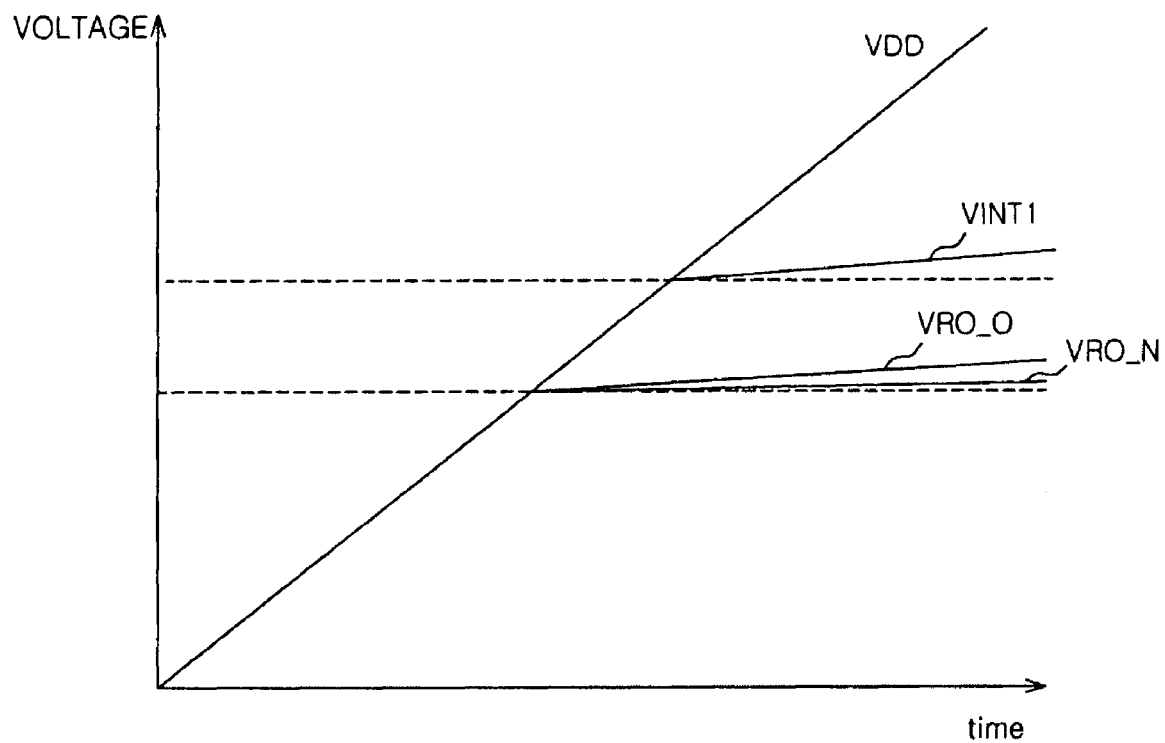
FIG. 7 is an exemplary graph illustrating a change of a first reference voltage according to an external supply voltage in a first reference voltage generator according to one embodiment shown in FIG. 4.

FIG. 7 is an exemplary graph illustrating a change of a first reference voltage according to an external supply voltage in the first reference voltage generator according to one embodiment shown in FIG. 4.

As shown in FIG. 7, when the external supply voltage VDD is lower than the predetermined voltage, the first reference voltage generator 300 according to one embodiment may apply the external supply voltage VDD and perform the same operation as the first reference voltage generator 10 according to the related art. When the external supply voltage VDD is higher than the predetermined voltage, the first reference voltage generator 300 may apply the first internal voltage VINT1, such that the first reference voltage VRO_N that may have a more stable voltage level than the first reference voltage VRO_O may be generated.

The voltage generating circuit of the semiconductor integrated circuit according to one embodiment may use the internal voltage as input power for the reference voltage generating circuit, instead of the external supply voltage, when the external supply voltage is higher than the predetermined voltage, which may makes it possible to generate the reference voltage and the internal voltage at stable levels.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A voltage generating circuit of a semiconductor integrated circuit, comprising:

a voltage controller adapted to receive an external supply voltage, detect the level of the external supply voltage, and output a voltage control signal, wherein the voltage controller is adapted to output the voltage control signal that is enabled when the external supply voltage is higher than a predetermined voltage and disabled when the external supply voltage is lower than the predetermined voltage;

a voltage supplier adapted to receive the voltage control signal and output one of the external supply voltage and a first internal voltage as an output voltage in response to the voltage control signal; and a first reference voltage generator adapted to receive the output voltage of the voltage supplier as a voltage source and generate a first reference voltage.

2. The voltage generating circuit of claim 1, further comprising:

a first internal voltage generator adapted to receive the first reference voltage and generate and output the first internal voltage in response to the first reference voltage.

3. The voltage generating circuit of claim 2, wherein the first internal voltage generator is adapted to supply the first internal voltage to the voltage supplier.

4. The voltage generating circuit of claim 1, further comprising:

a second reference voltage generator adapted to receive the output voltage of the voltage supplier and the first reference voltage and generate a second reference voltage in response to the first reference voltage.

5. The voltage generating circuit of claim 4, further comprising:

a second internal voltage generator adapted to receive the second reference voltage and generate and output a second internal voltage in response to the second reference voltage.

6. The voltage generating circuit of claim 1, wherein the voltage controller includes:

a voltage divider adapted to receive the external supply voltage, divide the external supply voltage and output a divided voltage; and a comparing unit adapted to receive the divided voltage and output a comparison signal in response to the divided voltage.

7. The voltage generating circuit of claim 6, wherein the voltage controller further includes:

a signal driver adapted to receive and drive the comparison signal and output the voltage control signal.

8. The voltage generating circuit of claim 6, wherein a signal driver is adapted to receive the comparison signal, drive the received comparison signal, and output the voltage control signal.

9. The voltage generating circuit of claim 6, wherein the voltage divider includes a plurality of resistors connected in series between an external supply voltage terminal and a ground voltage terminal.

10. The voltage generating circuit of claim 6, wherein the voltage divider is adapted to output the divided voltage from a node between two different resistors.

11. The voltage generating circuit of claim 6, wherein the comparing unit includes:

a pull-up portion adapted to receive the divided voltage and pull up a voltage of a first node in response to the divided voltage, wherein the voltage of the first node is the comparison signal; and a pull-down portion adapted to receive the divided voltage and pull down the voltage of the first node in response to the divided voltage, wherein the voltage of the first node is the comparison signal.

12. The voltage generating circuit of claim 1, wherein the voltage supplier includes:

a first switching unit adapted receive the voltage control signal and output the external supply voltage to a first node in response to the voltage control signal; and a second switching unit adapted to receive the voltage control signal and output the first internal voltage to the first node in response to the voltage control signal.

13. The voltage generating circuit of claim 12, wherein the voltage supplier is adapted to receive the voltage control signal and activate only one of the first switching unit and the second switching unit in response to the voltage control signal.

14. The voltage generating circuit of claim 1, wherein the voltage supplier is adapted to output the first internal voltage when the external supply voltage is higher than a predetermined voltage; and the voltage supplier is adapted to output the external supply voltage when the external supply voltage is lower than the predetermined voltage.

15. A voltage generating circuit of a semiconductor integrated circuit, comprising:

a voltage controller adapted to receive and detect a level of an external supply voltage and output a voltage control signal, wherein the voltage controller is adapted to output the voltage control signal that is enabled when the external supply voltage is higher than a predetermined voltage and disabled when the external supply voltage is lower than the predetermined voltage;

a voltage supplier adapted to receive the voltage control signal and output one of the external supply voltage and a first internal voltage as an output voltage in response to the voltage control signal;

a first reference voltage generator adapted to receive the output voltage of the voltage supplier as a voltage source and generate a first reference voltage; and a second reference voltage generator adapted to receive the output voltage of the voltage supplier as a voltage source and generate a second reference voltage in response to the first reference voltage.

16. The voltage generating circuit of claim 15, wherein the voltage controller includes:

a voltage divider adapted to receive and divide the external supply voltage and output a divided voltage;

a comparing unit adapted to receive the divided voltage and output a comparison signal in response to the divided voltage; and a signal driver adapted to receive and drive the comparison signal and output the voltage control signal.

17. The voltage generating circuit of claim 15, wherein the voltage supplier includes:

a first switching unit adapted to receive the voltage control signal and output the external supply voltage to a first node in response to the voltage control signal; and a second switching unit adapted to receive the voltage control signal and output the first internal voltage to the first node in response to the voltage control signal.

* * * * *